(12) United States Patent
Wang et al.

(10) Patent No.: US 10,960,670 B1
(45) Date of Patent: Mar. 30, 2021

(54) METHOD FOR ELECTROHYDRODYNAMIC JET PRINTING CURVED PIEZOELECTRIC CERAMICS

(71) Applicant: DALIAN UNIVERSITY OF TECHNOLOGY, Liaoning (CN)

(72) Inventors: Dazhi Wang, Liaoning (CN); Kuipeng Zhao, Liaoning (CN); Junsheng Liang, Liaoning (CN)

(73) Assignee: Dalian University of Technology, Liaoning (CN)

( * ) Notice: Subject to any disclaimer, the term of this patent is extended or adjusted under 35 U.S.C. 154(b) by 0 days.

(21) Appl. No.: 17/047,363

(22) PCT Filed: May 28, 2020

(86) PCT No.: PCT/CN2020/092926
§ 371 (c)(1),
(2) Date: Oct. 13, 2020

(51) Int. Cl.
*B41J 2/14* (2006.01)
*H01L 41/39* (2013.01)
*H01L 41/09* (2006.01)

(52) U.S. Cl.
CPC ...... *B41J 2/14233* (2013.01); *H01L 41/0973* (2013.01); *H01L 41/39* (2013.01)

(58) Field of Classification Search
CPC ... B41J 2/14233; H01L 41/39; H01L 41/0973
See application file for complete search history.

(56) References Cited

U.S. PATENT DOCUMENTS 6,144,008 A    11/2000    Rabinovich

FOREIGN PATENT DOCUMENTS

| CN | 105058549 A | 11/2015 |
|---|---|---|
| CN | 107159894 A | 9/2017 |
| CN | 108115810 A | 6/2018 |
| CN | 108748975 A | 11/2018 |
| CN | 108752010 A | 11/2018 |

(Continued)

OTHER PUBLICATIONS

Huang, Yong'an, Liu et al., "Piezoelectric type integrated spray head used for electrofluid jet printing", May 3, 2017, Abstract (Year: 2017).*

(Continued)

*Primary Examiner* — Lisa Solomon
(74) *Attorney, Agent, or Firm* — Muncy, Geissler, Olds & Lowe, P.C.

(57) ABSTRACT

The present invention provides a method for electrohydrodynamic jet printing curved piezoelectric ceramics. First, a stable pressure is provided for a piezoelectric ceramic slurry to ensure that the slurry flows out from a nozzle at a fixed flow rate, and at the same time, an electric field is applied to the piezoelectric ceramic slurry at the nozzle to form a stable fine jet; then a curved substrate is fixed on a fixture of a curved substrate six-axis linkage module to ensure that the curved substrate is always perpendicular to the jet of the nozzle and keeps a constant distance from the nozzle during a printing process; fine jet drop on demand is realized through cooperative control of the changes of the curved substrate six-axis linkage module, the electric field and a flow field, and electrohydrodynamic jet printing and molding of curved piezoelectric ceramics is finally realized.

8 Claims, 2 Drawing Sheets

(56) References Cited

FOREIGN PATENT DOCUMENTS

| | | |
|---|---|---|
| CN | 110509394 A | 11/2019 |
| CN | 110509395 A | 11/2019 |

OTHER PUBLICATIONS

NPL (Year: 2020).*
Huang, Yong'an, Liu et al., "Piezoelectric type integrated spray head used for electrofluid jet printing", May 3, 2017, Paragraphs 0018-0028 (Year: 2017).*

* cited by examiner

METHOD FOR ELECTROHYDRODYNAMIC JET PRINTING CURVED PIEZOELECTRIC CERAMICS

TECHNICAL FIELD

The present invention belongs to the technical field of advanced manufacturing, and relates a method for electrohydrodynamic jet printing curved piezoelectric ceramics.

BACKGROUND

In recent years, intelligent equipment has continually developed in the direction of miniaturization, integration and intelligentization. This status puts forward higher requirements for electromechanical systems, and functions such as comprehensive spatial information collection and curved surface driving deformation need to be realized. In the field of sensing and driving, piezoelectric ceramics, as sensitive sensing and driving elements, are widely used due to the advantages such as fast response, simple structure and high sensitivity.

At present, a deformable wing aircraft in the field of aerospace need to integrate hundreds of piezoelectric micro-drivers on a curved wing surface to achieve coordinated deformation. A submarine in the field of navigation engineering need to capture multi-directional signals in space to achieve accurate navigation control of the submarine; and a hydrophone of a marine early warning sonar system need to perceive information in different directions in a water area to realize accurate identification of unknown objects in various directions. However, piezoelectric sensing and driving sensitive elements generally have planar structures. When sensing and driving is carried out for spatial curved structures, piezoelectric ceramic blocks are usually processed into thin sheets to be installed on a curved substrate by splicing, pasting, etc. This method has the problems such as low precision and difficulty in pasting, which limits the sensitivity and reliability of complex curved surface sensing and driving. In addition, this method also has the problems such as adhesive creep and low bonding strength between piezoelectric ceramics and a substrate, which seriously affects the performance of devices.

SUMMARY

To solve the problems existing in the prior art, the present invention provides a method for electrohydrodynamic jet printing curved piezoelectric ceramics. A piezoelectric ceramic slurry is used to form a micro-nano-level fine jet under the action of electric field force through the effect of "electrohydrodynamics", and a micro-nano-level curved piezoelectric ceramic pattern is directly printed and manufactured in combination with the method of cooperative control of a curved substrate six-axis linkage system and a fine jet drop on demand system. This method eliminates the splicing, transfer and pasting processes of traditional curved piezoelectric ceramics, simplifies the fabrication process, improves the shape and position precision and bonding strength of piezoelectric ceramics, and improves the electrical and mechanical performances of piezoelectric devices. This method solves the manufacturing problems of curved piezoelectric ceramics, and realizes the high-precision and high-performance manufacturing of curved piezoelectric ceramics.

To achieve the above purpose, the present invention adopts the following technical solution:

A method for electrohydrodynamic jet printing of curved piezoelectric ceramics, wherein a curved piezoelectric ceramics electrohydrodynamic jet printing and forming device comprising an electrohydrodynamic jet piezoelectric ceramic module and a curved substrate six-axis linkage module is used to realize the printing of curved piezoelectric ceramics; first, a stable pressure is provided by the electrohydrodynamic jet piezoelectric ceramic module for a piezoelectric ceramic slurry to ensure that the piezoelectric ceramic slurry flows out from a nozzle at a fixed flow rate, and at the same time, an electric field is applied to the piezoelectric ceramic slurry at the nozzle to form a fine jet; then a curved substrate 23 is fixed on a replaceable fixture 19 of the curved substrate six-axis linkage module to ensure that the curved substrate 23 is always perpendicular to the fine jet and keeps a constant distance from the nozzle during a printing process; fine jet drop on demand is realized through cooperative control of the changes of the curved substrate six-axis linkage module, the electric field and a flow field, and electrohydrodynamic jet printing and forming of complex curved piezoelectric ceramic structures is finally realized.

The specific composition of the curved piezoelectric ceramics electrohydrodynamic jet printing and forming device is as follows:

The electrohydrodynamic jet piezoelectric ceramic module comprises a PC industrial control computer 1, a CCD observing camera 2, a syringe pump 4, a precision injector 5, a hose 6, a nozzle 7 and a high-voltage power supply 8; the precision injector 5 is fixed on the syringe pump 4 and is connected with the nozzle 7 through the hose 6, and the nozzle 7 is fixed on a Z-axis sliding block of a three-dimensional motion device 10 and is located above a three-dimensional rotating device 9; a positive electrode output end of the high-voltage power supply 8 is connected with the nozzle 7, and a negative electrode output end thereof is connected with the replaceable fixture 19 in the three-dimensional rotating device 9; the ceramic slurry is used as a raw material ink and is stored in the precision injector 5; after powered on, the syringe pump 4 controls the precision injector 5 to inject the raw material ink from the nozzle 7 through the hose 6 and realize electrohydrodynamic jet printing; the CCD observing camera 2, the syringe pump 4 and the high-voltage power supply 8 are connected with the PC industrial control computer 1, the stability of the jet during the printing process is observed by the CCD observing camera 2, and the injection of the syringe pump 4 and the energization of the high-voltage power supply 8 are controlled by the PC industrial control computer 1.

The curved substrate six-axis linkage module comprises the PC industrial control computer 1, a positioning camera 3, the three-dimensional rotating device 9 and the three-dimensional motion device 10; the three-dimensional rotating device 9 comprises a conductive slip ring 11, a circumferential rotary bracket 12, a Y-direction rotary stepping motor 13, a Y-direction rotary bracket 14, an X-direction rotary bracket 16, a leveling balance weight 17, the replaceable fixture 19, an X-direction rotary stepping motor 20, a circumferential rotary motor 22, an X-direction rotary limit sensor 18, a Y-direction rotary limit sensor 15 and a Z-direction rotary limit sensor 21; the Y-direction rotary bracket 14 and the X-direction rotary bracket 16 have frame structures and are respectively controlled by the Y-direction rotary stepping motor 13 and the X-direction rotary stepping motor 20 to provide Y-direction and X-direction rotary moments; the replaceable fixture 19 is fixedly installed on the X-direction rotary bracket 16, and the X-direction rotary bracket 16 is installed on the Y-direction rotary bracket 14 through an installation shaft and rotates around the shaft; the Y-direction rotary bracket 14 is installed on the circumferential rotary bracket 12 through an installation shaft and rotates around the shaft; the circumferential rotary bracket 12 provides a circumferential rotary moment through the circumferential rotary motor 22, ensures printing uniformity, and is forced to rotate circumferentially around a base; thereby, the replaceable fixture 19 is driven to make non-plane motion through the cooperation of the motors and the rotary brackets; both the X-direction rotary stepping motor 20 and the leveling balance weight 17 are installed on the Y-direction rotary bracket 14 at symmetrical positions, and the weight of the X-direction rotary stepping motor 20 is balanced by the leveling balance weight 17; the X-direction rotary limit sensor 18, the Y-direction rotary limit sensor 15 and the Z-direction rotary limit sensor 21 are respectively installed on the X-direction rotary bracket 16, the Y-direction rotary bracket 14 and the circumferential rotary bracket 12 and are connected with the PC industrial control computer 1, so as to provide a reference origin and a limit point for the rotary motion of the module, and feedback a limit and return to zero through the PC industrial control computer 1; the conductive slip ring 11 is installed below the circumferential rotary bracket 12 to solve the winding problem of the control lines of the Y-direction rotary stepping motor 13, the X-direction rotary stepping motor 20, the X-direction rotary limit sensor 18, the Y-direction rotary limit sensor 15 and the Z-direction rotary limit sensor 21 caused by the rotation of the circumferential rotary motor 22; the curved substrate 23 is fixed on the replaceable fixture 19 and is fastened by a set screw 26; the three-dimensional rotating device 9 is installed on an X/Y two-dimensional mobile platform of the three-dimensional motion device 10, the X-axis and Y-axis translational motion of the three-dimensional rotating device 9 is realized through the three-dimensional motion device 10, and the distance between the nozzle 7 and the curved substrate 23 is adjusted by adjusting the position of the Z-axis sliding block of the three-dimensional motion device 10; both the three-dimensional rotating device 9 and the three-dimensional motion device 10 are connected with the PC industrial control computer 1, and are under the cooperative control of the PC industrial control computer 1 to realize six-axis linkage motion, realize the X-axis and Y-axis rotary motion and circumferential rotary motion of the curved substrate 23, and thereby realizing the motion of complex piezoelectric ceramics along a curved surface path; the positioning camera 3 is fixed on the Z-axis sliding block of the three-dimensional motion device 10, is located above the three-dimensional rotating device 9, and is connected with the PC industrial control computer 1, and precise and repeated positioning of the path of the curved substrate 23 is realized by the cooperation of the positioning camera 3 and the three-dimensional motion device 10.

The specific steps for electrohydrodynamic jet printing of a complex curved piezoelectric ceramic structure are as follows:

1) Electrohydrodynamic jet piezoelectric ceramic slurry

Adjusting the height of the nozzle 7, and applying a voltage between the nozzle 7 and the replaceable fixture 19 by the high-voltage power supply 8 to form a stable electric field; the ceramic slurry is pushed by the syringe pump 4 to flow from the precision injector 5 to an outlet of the nozzle 7 through the hose 6 and form a stable fine jet at the outlet of the printing needle 7 under the action of the electric field and a gravity field, and can be printed on the curved substrate 23 in a subsequent process; and printing situation of the jet in the visual field of the CCD observing camera 2 is monitored on a screen of the PC industrial control computer 1;

2) Electrohydrodynamic jet printing and forming of curved piezoelectric ceramics Positioning through the PC industrial control computer 1 by observing the positioning camera 3 and controlling the motion of the three-dimensional motion device 10, so as to drive the three-dimensional rotating device 9 to move to a predetermined printing point, realize initial position setting, adjust the initial attitude of the three-dimensional rotating device 9 through the feedback of the PC industrial control computer 1 and the three limit sensors; in the process of generating the fine jet by the electrohydrodynamic jet piezoelectric ceramic module, the PC industrial control computer 1 is used to set a non-plane motion path of the curved substrate six-axis linkage module, so as to control the work of the stepping motors, force the curved substrate 23 to make rotary motion according to a predetermined non-plane motion path, control the injection of the syringe pump 4, and realize the electrohydrodynamic jet printing and forming of curved piezoelectric ceramics; the non-plane motion path ensures that the distance between the nozzle 7 and the printing point on the curved substrate 23 remains unchanged, and ensures that the nozzle 7 is always perpendicular to the tangent surface of the curved surface at the printing point; after the first layer is printed, the three-dimensional rotating device 9 is locked, the three-dimensional motion device 10 is unlocked, and the curved substrate 23 is moved out for heat treatment; the above steps are repeated to print a next layer until a specified printing thickness is met, and then a desired curved piezoelectric ceramic structure is obtained by sinter forming.

The output voltage range of the high-voltage power supply 8 is 500 V-6000 V.

The X-direction rotary limit sensor 18, the Y-direction rotary limit sensor 15 and the Z-direction rotary limit sensor 21 are hall sensors, but are not limited to such sensors.

The rotary speed of the Y-direction rotary stepping motor 13, the X-direction rotary stepping motor 20 and the circumferential rotary motor 22 is 0-2000 r/min.

The curved substrate 23 has a curved surface structure of different sizes, such as a half ball surface, a half cylindrical shape and a conical surface.

The replaceable fixture 19 can be replaced with different fixtures according to the shape and size of the curved substrate 23 to meet different requirements.

The thickness of curved piezoelectric ceramics is 1-200 μm.

The present invention has the following beneficial effects: the method of the present invention realizes the printing and forming of complex curved piezoelectric ceramics. The present invention avoids the problems such as low precision and difficulty in pasting of traditional manufacturing processes as well as adhesive creep and low bonding strength between piezoelectric ceramics and a substrate, improves the sensitivity and reliability of complex curved surface sensing and driving devices, and has the advantages of wide application range, simple operation and low cost.

Figure 1:
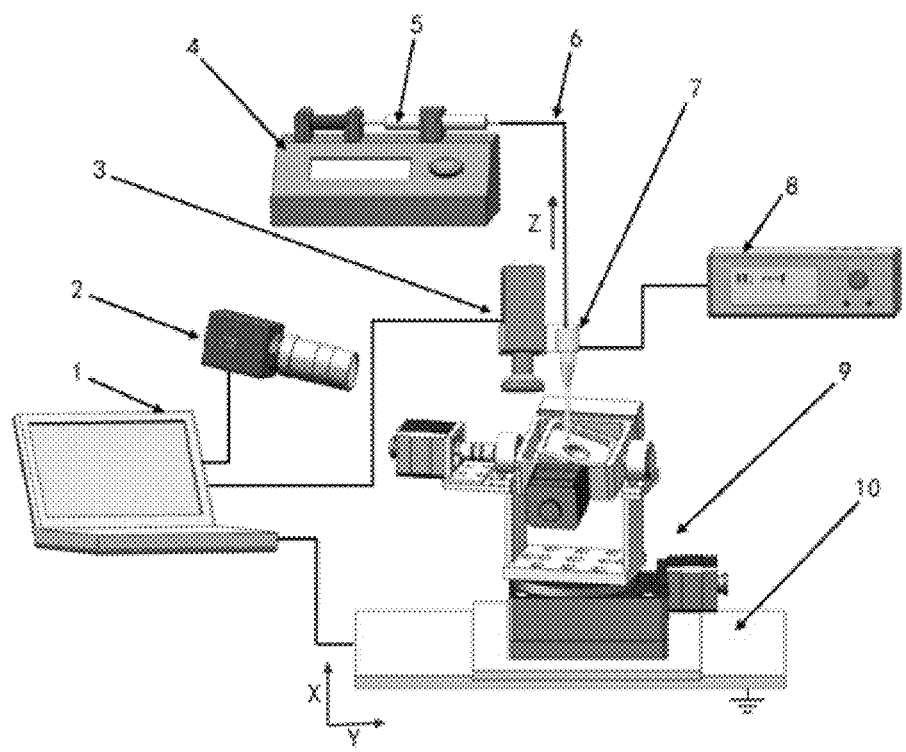
FIG. 1 is a three-dimensional schematic diagram of a curved piezoelectric ceramics electrohydrodynamic jet printing and forming device adopted by the present invention.
Figure 2:
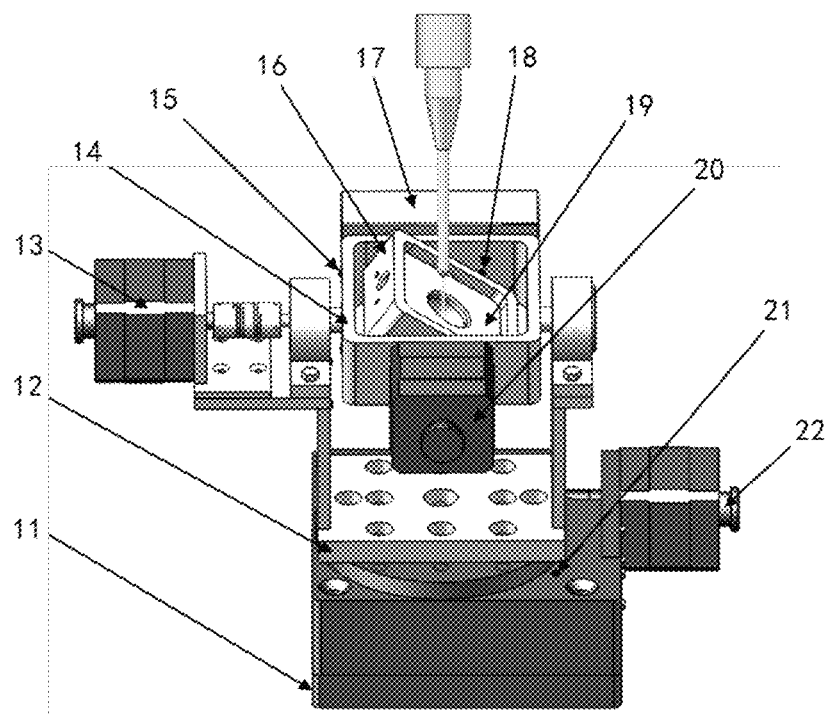
FIG. 2 is a three-dimensional schematic diagram of a three-dimensional rotating device.
Figure 3:
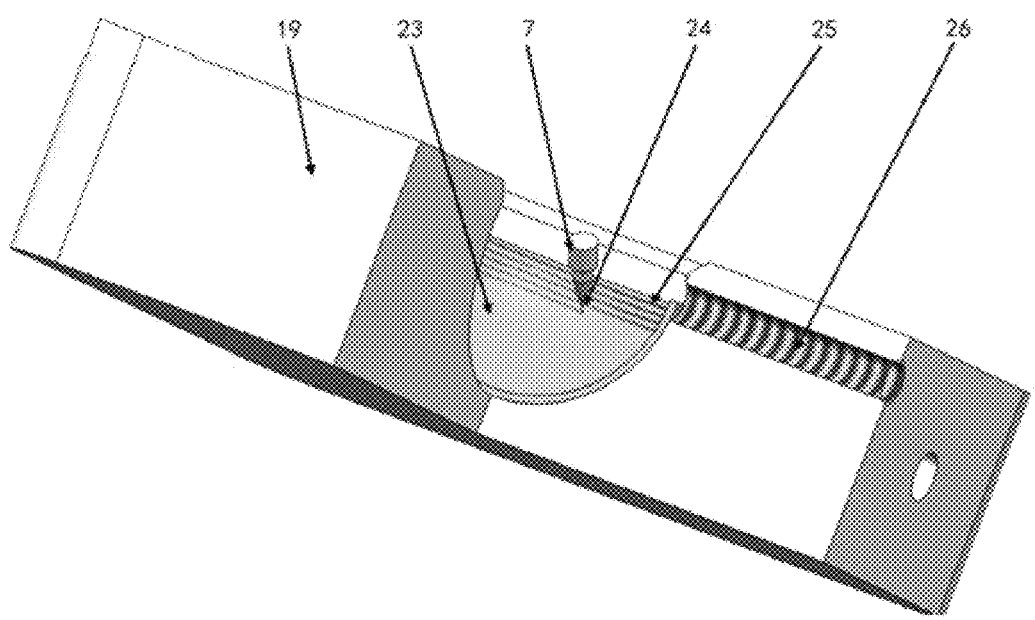
FIG. 3 is a schematic diagram of electrohydrodynamic jet printed piezoelectric ceramics.

In the figures: 1 PC industrial control computer; 2 CCD observing camera; 3 positioning camera; 4 syringe pump; 5 precision injector; 6 hose; 7 nozzle; 8 high-voltage power supply; 9 three-dimensional rotating device; 10 three-dimensional motion device; 11 conductive slip ring; 12 circumferential rotary bracket; 13 Y-direction rotary stepping motor; 14 Y-direction rotary bracket; 15 Y-direction rotary limit sensor; 16 X-direction rotary bracket; 17 leveling balance weight; 18 X-direction rotary limit sensor; 19 the replaceable fixture; 20 X-direction rotary stepping motor; 21 Z-direction rotary limit sensor; 22 circumferential rotary motor; 23 curved substrate; 24 Taylor cone; 25 printing path; and 26 set screw.

DETAILED DESCRIPTION

The present invention is further described below in combination with the technical solution and accompanying drawings. An electrohydrodynamic jet printing device adopted in an embodiment mainly comprises an electrohydrodynamic jet piezoelectric ceramic module and a curved substrate six-axis linkage module.

The precision injector 5 is installed on the syringe pump 4 and contains "ZnO slurry" inside. The nozzle 7 is connected with the precision injector 5 through the hose 6, is fixed on the Z-axis sliding block of the three-dimensional motion device 10, and can move in a vertical direction. The output voltage of the high-voltage power supply 8 is 1200 V, a positive electrode output end thereof is connected with the nozzle 7, and a negative electrode output end thereof is connected with the replaceable fixture 19 in the three-dimensional rotating device 9. The positioning camera 3 is fixed on the Z-axis sliding block of the three-dimensional motion device 10 and remains stationary relative to the nozzle 7 in order to realize precise and repeated positioning. The curved substrate 23 (a spherical substrate is used in the embodiment) to be printed is placed and fixed in the replaceable fixture 19, the X/Y mobile platform of the three-dimensional motion device 10 can drive the three-dimensional rotating device 9 to make translational motion as a whole and translate to a position where the extension line of the nozzle 7 passes through the sphere center of the spherical substrate. The three-dimensional rotating device 9 can realize spherical motion around the sphere center of the substrate; the linked rotary cooperation of the three-dimensional rotating device 9 is controlled by the PC industrial control computer 1 to realize the spherical helical motion of the nozzle 7 relative to the curved substrate 23, achieve spherical path cross-free jet printing, and ensure the uniformity of a prepared thick ceramic film. The PC industrial control computer 1 and the CCD observing camera 2 are connected through a USB data line to monitor the stability of the Taylor cone in a printing area and the path motion on a spherical surface in real time.

The specific implementation steps of the embodiment are as follows:

1) Electrohydrodynamic jet piezoelectric ceramic slurry

The positive electrode output end and the negative electrode output end of the high-voltage power supply 8 are respectively connected with the nozzle 7 and the replaceable fixture 19; a voltage of 1200 V is applied by the high-voltage power supply 8; a ZnO suspension liquid is used as the "ceramic slurry"; and the ZnO suspension liquid is pushed slowly by the syringe pump 4 to flow from the precision injector 5 to an outlet of the nozzle 7 through the hose 6 at a flow rate of 0.5 μL/min and form a stable Taylor cone 24 at the nozzle of the nozzle 7 under the action of the electric field and a gravity field, and spray deposited on the curved substrate 23 to form deposit layers. The curved substrate 23 is placed in the replaceable fixture 19 and is fixed by the set screw 26, the distance between the nozzle 7 and the substrate is adjusted by the Z-axis of the three-dimensional motion device 10 to be about 600 μm, and the thickness of each deposit layer is about 1 μm. Printing situation of a cone jet in the visual field of the CCD observing camera 2 can be monitored on a screen of the PC industrial control computer 1.

2) Electrohydrodynamic jet printing and forming of curved piezoelectric ceramics Before printing, first of all, the nozzle 7 is moved to a suitable height through step 1), an initial point and a printing point of the nozzle 7 is set by the positioning camera 3, and the nozzle 7 is ensured to pass through the sphere center of a printed spherical surface at the printing point; then the PC industrial control computer 1 drives the three-dimensional rotating device 9 to be positioned to a predetermined printing point through the positioning camera 3 and the three-dimensional motion device 10, X-axis, Y-axis and Z-axis translation is locked, and the initial attitude of the three-dimensional rotating device 9 is adjusted through the feedback of the PC industrial control computer 1 and the three limit sensors (the X-direction rotary limit sensor 18, the Y-direction rotary limit sensor 15 and the Z-direction rotary limit sensor 21); then the PC industrial control computer 1 controls the linkage of the stepping motors (the Y-direction rotary stepping motor 13 and the X-direction rotary stepping motor 20) of the three-dimensional rotating device 9 according to an established program to make the curved substrate 23 do spherical rotary motion around the sphere center thereof, and the printing path 25 formed is a spherical helix; the PC industrial control computer 1 controls the motors to start and at the same time controls the syringe pump 4 and the high-voltage power supply 8 to work, and is powered off immediately after printing. During printing, the circumferential rotary motor 22 drives the circumferential rotary bracket 12 to rotate in real time so as to ensure the uniformity of a printed curved surface. After printing, the three-dimensional rotating device 9 is locked, the three-dimensional motion device 10 is unlocked, and the curved substrate 23 is moved out for heat treatment. The above steps are repeated to print a second layer until a specified printing thickness is met, and then a desired half ball surface ceramic structure can be obtained by sinter forming.

The present invention provides a method for electrohydrodynamic jet printing curved piezoelectric ceramics, which uses the "ceramic slurry" to inject a micro-nano-level fine jet under the combined action of electric field force, gravity, surface tension, viscous force, etc., realizes the drop on demand manufacturing of complex curved ceramics having a half ball surface, a half cylindrical shape, etc. through the cooperative control of the three-dimensional motion device 10, the three-dimensional rotating device 9, the syringe pump 4 and the high-voltage power supply 8, and ensures the stability of the printing jet and the uniformity of the printed curved surface. The present invention avoids the pasting and splicing processes in a traditional manufacturing process of complex curved surface of piezoelectric ceramics, eliminates the problems such as signal delay and distortion on the superposition and fitting of spatial signals caused by traditional devices, and improves the sensitivity and reliability of complex curved surface sensing and driving devices.

The invention claimed is:

1. A method for electrohydrodynamic jet printing curved piezoelectric ceramics, wherein a curved piezoelectric ceramics electrohydrodynamic jet printing and forming device comprising an electrohydrodynamic jet piezoelectric ceramic module and a curved substrate six-axis linkage module is used to realize the printing of curved piezoelectric ceramics; first, a stable pressure is provided by the electrohydrodynamic jet piezoelectric ceramic module for a piezoelectric ceramic slurry to ensure that the piezoelectric ceramic slurry flows out from a nozzle at a fixed flow rate, and at the same time, an electric field is applied to the piezoelectric ceramic slurry at the nozzle to form a fine jet; then a curved substrate is fixed on a replaceable fixture of the curved substrate six-axis linkage module to ensure that the curved substrate is always perpendicular to the fine jet and keeps a constant distance from the nozzle during a printing process; fine jet drop on demand is realized through cooperative control of the changes of the curved substrate six-axis linkage module, the electric field and a flow field, and electrohydrodynamic jet printing and forming of complex curved surface structure piezoelectric ceramics is finally realized;

the specific composition of the curved piezoelectric ceramics electrohydrodynamic jet printing and forming device is as follows:

the electrohydrodynamic jet piezoelectric ceramic module comprises a PC industrial control computer, a CCD observing camera, a syringe pump, a precision injector, a hose, a nozzle and a high-voltage power supply; the precision injector is fixed on the syringe pump and is connected with the nozzle through the hose, and the nozzle is fixed on a Z-axis sliding block of a three-dimensional motion device and is located above a three-dimensional rotating device; a positive electrode output end of the high-voltage power supply is connected with the nozzle, and a negative electrode output end thereof is connected with the replaceable fixture in the three-dimensional rotating device; the ceramic slurry is used as a raw material ink and is stored in the precision injector; after powered on, the syringe pump controls the precision injector to inject the raw material ink from the nozzle through the hose and realize electrohydrodynamic jet printing; the CCD observing camera, the syringe pump and the high-voltage power supply are connected with the PC industrial control computer, the stability of the jet during the printing process is observed by the CCD observing camera, and the injection of the syringe pump and the energization of the high-voltage power supply are controlled by the PC industrial control computer;

the curved substrate six-axis linkage module comprises the PC industrial control computer, a positioning camera, the three-dimensional rotating device and the three-dimensional motion device; the three-dimensional rotating device comprises a conductive slip ring, a circumferential rotary bracket, a Y-direction rotary stepping motor, a Y-direction rotary bracket, an X-direction rotary bracket, a leveling balance weight, the replaceable fixture, an X-direction rotary stepping motor, a circumferential rotary motor, an X-direction rotary limit sensor, a Y-direction rotary limit sensor and a Z-direction rotary limit sensor; the Y-direction rotary bracket and the X-direction rotary bracket have frame structures and are respectively controlled by the Y-direction rotary stepping motor and the X-direction rotary stepping motor to provide Y-direction and X-direction rotary moments; the replaceable fixture is fixedly installed on the X-direction rotary bracket, and the X-direction rotary bracket is installed on the Y-direction rotary bracket through an installation shaft and rotates around the shaft; the Y-direction rotary bracket is installed on the circumferential rotary bracket through an installation shaft and rotates around the shaft; the circumferential rotary bracket provides a circumferential rotary moment through the circumferential rotary motor, ensures printing uniformity, and is forced to rotate circumferentially around a base; thereby, the replaceable fixture is driven to make non-plane motion through the cooperation of the motors and the rotary brackets; both the X-direction rotary stepping motor and the leveling balance weight are installed on the Y-direction rotary bracket at symmetrical positions, and the weight of the X-direction rotary stepping motor is balanced by the leveling balance weight; the X-direction rotary limit sensor, the Y-direction rotary limit sensor and the Z-direction rotary limit sensor are respectively installed on the X-direction rotary bracket, the Y-direction rotary bracket and the circumferential rotary bracket and are connected with the PC industrial control computer, so as to provide a reference origin and a limit point for the rotary motion of the module, and feed back a limit and return to zero through the PC industrial control computer; the conductive slip ring is installed below the circumferential rotary bracket to solve the winding problem of the control lines of the Y-direction rotary stepping motor, the X-direction rotary stepping motor, the X-direction rotary limit sensor, the Y-direction rotary limit sensor and the Z-direction rotary limit sensor caused by the rotation of the circumferential rotary motor; the curved substrate is fixed on the replaceable fixture and is fastened by a set screw; the three-dimensional rotating device is installed on an X/Y two-dimensional mobile platform of the three-dimensional motion device, the X-axis and Y-axis translational motion of the three-dimensional rotating device is realized through the three-dimensional motion device, and the distance between the nozzle and the curved substrate is adjusted by adjusting the position of the Z-axis sliding block of the three-dimensional motion device; both the three-dimensional rotating device and the three-dimensional motion device are connected with the PC industrial control computer, and are under the cooperative control of the PC industrial control computer to realize six-axis linkage motion, realize the X-axis and Y-axis rotary motion and circumferential rotary motion of the curved substrate, and thereby realizing the motion of complex piezoelectric ceramics along a curved surface path; the positioning camera is fixed on the Z-axis sliding block of the three-dimensional motion device, is located above the three-dimensional rotating device, and is connected with the PC industrial control computer, and precise and repeated positioning of the path of the curved substrate is realized by the cooperation of the positioning camera and the three-dimensional motion device;

the specific steps for electrohydrodynamic jet printing of a complex curved piezoelectric ceramic structure are as follows:

1) electrohydrodynamic jet piezoelectric ceramic slurry adjusting the height of the nozzle, and applying a voltage between the nozzle and the replaceable fixture by the high-voltage power supply to form a stable electric field; the ceramic slurry is pushed by the syringe pump to flow from the precision injector to an outlet of the nozzle through the hose and form a stable fine jet at the nozzle of the nozzle under the action of the electric field and a gravity field, and can be printed on the curved substrate in a subsequent process; and printing situation of the jet in the field of view of the CCD observing camera is monitored on a screen of the PC industrial control computer;

2) electrohydrodynamic jet printing and forming of curved piezoelectric ceramics positioning through the PC industrial control computer by observing the positioning camera and controlling the motion of the three-dimensional motion device, so as to drive the three-dimensional rotating device to move to a predetermined printing point, realize initial position setting, adjust the initial attitude of the three-dimensional rotating device through the feedback of the PC industrial control computer and the three limit sensors; in the process of generating the fine jet by the electrohydrodynamic jet piezoelectric ceramic module, the PC industrial control computer is used to set a non-plane motion path of the curved substrate six-axis linkage module, so as to control the work of the stepping motors, force the curved substrate to make rotary motion according to a predetermined non-plane motion path, control the injection of the syringe pump, and realize the electrohydrodynamic jet printing and forming of curved piezoelectric ceramics; the non-plane motion path ensures that the distance between the nozzle of the nozzle and the printing point on the curved substrate remains unchanged, and ensures that the nozzle is always perpendicular to the tangent surface of the curved surface at the printing point; after the first layer is printed, the three-dimensional rotating device is locked, the three-dimensional motion device is unlocked, and the curved substrate is moved out for heat treatment; the above steps are repeated to print a next layer until a specified printing thickness is met, and then a desired curved piezoelectric ceramic structure is obtained by sinter forming.

2. The method for electrohydrodynamic jet printing curved piezoelectric ceramics according to claim 1, wherein the output voltage range of the high-voltage power supply is 500 V-6000 V.

3. The method for electrohydrodynamic jet printing curved piezoelectric ceramics according to claim 1, wherein the X-direction rotary limit sensor, the Y-direction rotary limit sensor and the Z-direction rotary limit sensor are hall sensors; and the rotary speed of the Y-direction rotary stepping motor, the X-direction rotary stepping motor and the circumferential rotary motor is 0-2000 r/min.

4. The method for electrohydrodynamic jet printing curved piezoelectric ceramics according to claim 1, wherein the curved substrate has a curved surface structure of different sizes, comprising a half ball surface, a half cylindrical shape and a conical surface; and the replaceable fixture can be replaced with different fixtures according to the shape and size of the curved substrate.

5. The method for electrohydrodynamic jet printing curved piezoelectric ceramics according to claim 3, wherein the curved substrate has a curved surface structure of different sizes, comprising a half ball surface, a half cylindrical shape and a conical surface; and the replaceable fixture can be replaced with different fixtures according to the shape and size of the curved substrate.

6. The method for electrohydrodynamic jet printing curved piezoelectric ceramics according to claim 1, wherein the thickness of curved piezoelectric ceramics is 1-200 μm.

7. The method for electrohydrodynamic jet printing curved piezoelectric ceramics according to claim 3, wherein the thickness of curved piezoelectric ceramics is 1-200 μm.

8. The method for electrohydrodynamic jet printing curved piezoelectric ceramics according to claim 4, wherein the thickness of curved piezoelectric ceramics is 1-200 μm.

* * * * *